(12) United States Patent
Yang et al.

(10) Patent No.: US 7,144,517 B1
(45) Date of Patent: Dec. 5, 2006

(54) MANUFACTURING METHOD FOR LEADFRAME AND FOR SEMICONDUCTOR PACKAGE USING THE LEADFRAME

(75) Inventors: Sung Jin Yang, Kangnam-gu (KR); Doo Hwan Moon, Kwanggin-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 210 days.

(21) Appl. No.: 10/703,301

(22) Filed: Nov. 7, 2003

(51) Int. Cl.
 *H01B 13/00* (2006.01)
 *B44C 1/22* (2006.01)

(52) U.S. Cl. ............... 216/13; 216/41; 216/33; 216/36; 438/106

(58) Field of Classification Search ........... 216/13, 216/41, 33, 36; 438/106
See application file for complete search history.

(56) References Cited

U.S. PATENT DOCUMENTS

| | | | |
|---|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |

(Continued)

FOREIGN PATENT DOCUMENTS

DE 19734794 A1 8/1997

(Continued)

*Primary Examiner*—Shamim Ahmed
(74) *Attorney, Agent, or Firm*—Stetina Brunda Garred & Brucker

(57) ABSTRACT

In accordance with the present invention, there is provided a method for manufacturing a leadframe. The method comprises the initial step of bonding a primary leadframe to an adhesive tape layer, the primary leadframe including a die paddle and a plurality of leads which extend at least partially about the die paddle in spaced relation thereto. Thereafter, a photo resist is applied to the primary leadframe and to the adhesive tape layer. The photo resist is then patterned to define at least one exposed area in each of the leads of the primary leadframe. The exposed areas of the leads are then etched to divide the leads into an inner set which extends at least partially about the die paddle and an outer set which extends at least partially about the inner set. Thereafter, the photo resist is removed from the die paddle and from the inner and outer sets of the leads.

15 Claims, 9 Drawing Sheets

U.S. PATENT DOCUMENTS

| | | | |
|---|---|---|---|
| 5,018,003 A | 5/1991 | Yasunaga et al. | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson | |
| 5,118,298 A | 6/1992 | Murphy | |
| 5,151,039 A | 9/1992 | Murphy | |
| 5,157,475 A | 10/1992 | Yamaguchi | |
| 5,157,480 A | 10/1992 | McShane et al. | |
| 5,168,368 A | 12/1992 | Gow, 3rd et al. | |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,281,849 A | 1/1994 | Singh Deo et al. | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,358,905 A | 10/1994 | Chiu | |
| 5,365,106 A | 11/1994 | Watanabe | |
| 5,381,042 A | 1/1995 | Lerner et al. | |
| 5,391,439 A | 2/1995 | Tomita et al. | |
| 5,406,124 A | 4/1995 | Morita et al. | |
| 5,410,180 A | 4/1995 | Fujii et al. | |
| 5,414,299 A | 5/1995 | Wang et al. | |
| 5,424,576 A | 6/1995 | Djennas et al. | |
| 5,428,248 A | 6/1995 | Cha | |
| 5,435,057 A | 7/1995 | Bindra et al. | |
| 5,444,301 A | 8/1995 | Song et al. | |
| 5,452,511 A | 9/1995 | Chang | |
| 5,454,905 A | 10/1995 | Fogelson | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono et al. | |
| 5,528,076 A | 6/1996 | Pavio | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,267 A | 3/1997 | Mahulikar et al. | |
| 5,625,222 A | 4/1997 | Yoneda et al. | |
| 5,633,528 A | 5/1997 | Abbott et al. | |
| 5,683,943 A * | 11/1997 | Yamada | 216/14 |
| 6,006,424 A * | 12/1999 | Kim et al. | 29/827 |
| 6,093,584 A | 7/2000 | Fjelstad | |
| 6,194,777 B1 | 2/2001 | Abbott et al. | |
| 6,197,615 B1 | 3/2001 | Song et al. | |
| 6,198,171 B1 | 3/2001 | Huang et al. | |
| 6,201,186 B1 | 3/2001 | Daniels et al. | |
| 6,201,292 B1 | 3/2001 | Yagi et al. | |
| 6,204,554 B1 | 3/2001 | Ewer et al. | |
| 6,208,020 B1 | 3/2001 | Minamio | |
| 6,208,021 B1 | 3/2001 | Ohuchi et al. | |
| 6,208,023 B1 | 3/2001 | Nakayama et al. | |
| 6,211,462 B1 | 4/2001 | Carter, Jr. et al. | |
| 6,218,731 B1 | 4/2001 | Huang et al. | |
| 6,222,258 B1 | 4/2001 | Asano et al. | |
| 6,225,146 B1 | 5/2001 | Yamaguchi et al. | |
| 6,229,200 B1 | 5/2001 | Mclellan et al. | |
| 6,229,205 B1 | 5/2001 | Jeong et al. | |
| 6,239,367 B1 | 5/2001 | Hsuan et al. | |
| 6,239,384 B1 | 5/2001 | Smith et al. | |
| 6,242,281 B1 | 6/2001 | Mclellan et al. | |
| 6,256,200 B1 | 7/2001 | Lam et al. | |
| 6,258,629 B1 | 7/2001 | Niones et al. | |
| 6,281,566 B1 | 8/2001 | Magni | |
| 6,281,568 B1 | 8/2001 | Glenn et al. | |
| 6,282,095 B1 | 8/2001 | Houghton et al. | |
| 6,285,075 B1 | 9/2001 | Combs et al. | |
| 6,291,271 B1 | 9/2001 | Lee et al. | |
| 6,291,273 B1 | 9/2001 | Miyaki et al. | |
| 6,294,100 B1 | 9/2001 | Fan et al. | |
| 6,294,830 B1 | 9/2001 | Fjelstad | |
| 6,295,977 B1 | 10/2001 | Ripper et al. | |
| 6,297,548 B1 | 10/2001 | Moden et al. | |
| 6,303,984 B1 | 10/2001 | Corisis | |
| 6,303,997 B1 | 10/2001 | Lee | |
| 6,307,272 B1 | 10/2001 | Takahashi et al. | |
| 6,309,909 B1 | 10/2001 | Ohgiyama | |
| 6,316,822 B1 | 11/2001 | Venkateshwaran et al. | |
| 6,316,838 B1 | 11/2001 | Ozawa et al. | |
| 6,323,550 B1 | 11/2001 | Martin et al. | |
| 6,326,243 B1 | 12/2001 | Suzuya et al. | |
| 6,326,244 B1 | 12/2001 | Brooks et al. | |
| 6,326,678 B1 | 12/2001 | Karmezos et al. | |
| 6,335,564 B1 | 1/2002 | Pour | |
| 6,337,510 B1 | 1/2002 | Chun-Jen et al. | |
| 6,339,255 B1 | 1/2002 | Shin | |
| 6,348,726 B1 | 2/2002 | Bayan et al. | |
| 6,355,502 B1 | 3/2002 | Kang et al. | |
| 6,369,447 B1 | 4/2002 | Mori | |
| 6,369,454 B1 | 4/2002 | Chung | |
| 6,373,127 B1 | 4/2002 | Baudouin et al. | |
| 6,380,048 B1 | 4/2002 | Boon et al. | |
| 6,384,472 B1 | 5/2002 | Huang | |
| 6,388,336 B1 | 5/2002 | Venkateshwaran et al. | |
| 6,395,578 B1 | 5/2002 | Shin et al. | |
| 6,400,004 B1 | 6/2002 | Fan et al. | |
| 6,410,979 B1 | 6/2002 | Abe | |
| 6,414,385 B1 | 7/2002 | Huang et al. | |
| 6,420,779 B1 | 7/2002 | Sharma et al. | |
| 6,429,508 B1 | 8/2002 | Gang | |
| 6,437,429 B1 | 8/2002 | Su et al. | |
| 6,444,499 B1 | 9/2002 | Swiss et al. | |
| 6,448,633 B1 | 9/2002 | Yee et al. | |
| 6,452,279 B1 | 9/2002 | Shimoda | |
| 6,464,121 B1 | 10/2002 | Reijnders | |
| 6,476,469 B1 | 11/2002 | Hung et al. | |
| 6,476,474 B1 | 11/2002 | Hung | |
| 6,482,680 B1 | 11/2002 | Khor et al. | |
| 6,498,099 B1 | 12/2002 | McLellan et al. | |
| 6,498,392 B1 | 12/2002 | Azuma | |
| 6,507,096 B1 | 1/2003 | Gang | |

| | | | | | | |
|---|---|---|---|---|---|---|
| 6,507,120 B1 | 1/2003 | Lo et al. | | JP | 6139555 | 2/1986 |
| 6,534,849 B1 | 3/2003 | Gang | | JP | 629639 | 1/1987 |
| 6,545,345 B1 | 4/2003 | Glenn et al. | | JP | 63067762 | 3/1988 |
| 6,559,525 B1 | 5/2003 | Huang | | JP | 63205935 | 8/1988 |
| 6,566,168 B1 | 5/2003 | Gang | | JP | 63233555 | 9/1988 |
| 6,624,059 B1 * | 9/2003 | Ball ............................ 438/612 | | JP | 63249345 | 10/1988 |
| 6,635,957 B1 | 10/2003 | Kwan et al. | | JP | 63316470 | 12/1988 |
| 6,646,339 B1 | 11/2003 | Ku et al. | | JP | 64054749 | 3/1989 |
| 6,713,322 B1 * | 3/2004 | Lee ............................ 438/123 | | JP | 1106456 | 4/1989 |
| 6,777,265 B1 | 8/2004 | Islam | | JP | 1175250 | 7/1989 |
| 6,812,552 B1 | 11/2004 | Islam et al. | | JP | 1205544 | 8/1989 |
| 2001/0008305 A1 | 7/2001 | McLellan et al. | | JP | 1251747 | 10/1989 |
| 2001/0014538 A1 | 8/2001 | Kwan et al. | | JP | 3177060 | 8/1991 |
| 2002/0011654 A1 | 1/2002 | Kimura | | JP | 4098864 | 9/1992 |
| 2002/0024122 A1 | 2/2002 | Jung et al. | | JP | 5129473 | 5/1993 |
| 2002/0027297 A1 | 3/2002 | Ikenaga et al. | | JP | 5166992 | 7/1993 |
| 2002/0140061 A1 | 10/2002 | Lee | | JP | 5283460 | 10/1993 |
| 2002/0140068 A1 | 10/2002 | Lee et al. | | JP | 692076 | 4/1994 |
| 2002/0163015 A1 | 11/2002 | Lee et al. | | JP | 6140563 | 5/1994 |
| 2003/0030131 A1 | 2/2003 | Lee et al. | | JP | 6260532 | 9/1994 |
| 2003/0073265 A1 | 4/2003 | Hu et al. | | JP | 7297344 | 11/1995 |
| 2003/0164554 A1 * | 9/2003 | Fee et al. ................... 257/787 | | JP | 7312405 | 11/1995 |
| 2004/0080025 A1 * | 4/2004 | Kasahara et al. ........... 257/666 | | JP | 864634 | 3/1996 |
| 2005/0003581 A1 * | 1/2005 | Lyu et al. ................... 438/109 | | JP | 8083877 | 3/1996 |
| | | | | JP | 8125066 | 5/1996 |
| | FOREIGN PATENT DOCUMENTS | | | JP | 8222682 | 8/1996 |
| EP | 5421117 | 6/1979 | | JP | 8306853 | 11/1996 |
| EP | 5950939 | 3/1984 | | JP | 98205 | 1/1997 |
| EP | 0393997 | 10/1990 | | JP | 98206 | 1/1997 |
| EP | 0459493 | 12/1991 | | JP | 98207 | 1/1997 |
| EP | 0720225 | 3/1996 | | JP | 992775 | 4/1997 |
| EP | 0720234 | 3/1996 | | JP | 9293822 | 11/1997 |
| EP | 0794572 A2 | 10/1997 | | JP | 10022447 | 1/1998 |
| EP | 0844665 | 5/1998 | | JP | 10163401 | 6/1998 |
| EP | 0936671 | 8/1999 | | JP | 10199934 | 7/1998 |
| EP | 098968 | 3/2000 | | JP | 556398 | 10/2000 |
| EP | 00150765 | 5/2000 | | JP | 2001060648 | 3/2001 |
| EP | 1032037 | 8/2000 | | JP | 200204397 | 8/2002 |
| JP | 55163868 | 12/1980 | | KR | 941979 | 1/1994 |
| JP | 5745959 | 3/1982 | | KR | 9772358 | 11/1997 |
| JP | 58160095 | 8/1983 | | KR | 100220154 | 6/1999 |
| JP | 59208756 | 11/1984 | | KR | 0049944 | 6/2002 |
| JP | 59227143 | 12/1984 | | WO | 10256240 | 9/1998 |
| JP | 60010756 | 1/1985 | | WO | 9956316 | 11/1999 |
| JP | 60116239 | 8/1985 | | WO | 9967821 | 12/1999 |
| JP | 60195957 | 10/1985 | | | | |
| JP | 60231349 | 11/1985 | | * cited by examiner | | |

MANUFACTURING METHOD FOR LEADFRAME AND FOR SEMICONDUCTOR PACKAGE USING THE LEADFRAME

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor packages, and more particularly to a method of manufacturing a semiconductor package which includes a plurality of leads arranged in multiple columns and rows.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component.

In the electronics industry, hand held portable applications such as cell phones, PDA's (Personal Digital Assistants), Bluetooth, and IMT2000 require semiconductor packages which are progressively smaller and lighter, yet of increasing performance. In many of the above-described conventional semiconductor packages wherein portions of the leads are partially exposed within the package body, such leads are typically included along only the peripheral edge of the package body. To meet the requirements of current hand held portable applications, the semiconductor packages used therein must have higher electrical performance and functionality, and thus increased numbers of leads which are electrically connectable to an external device. Although it has been suggested in the prior art to narrow the pitch of the leads formed at the periphery of the bottom surface of the package body to increase the number of leads, there are physical limitations in narrowing the lead pitch during the manufacture of the leadframe. Also, excessive narrowing in the lead pitch gives rise to a susceptibility of solder shorting between the leads when the semiconductor package is connected to an external device through the use of solder.

Other currently known semiconductor package designs provide increased numbers of leads by arranging the leads on a common surface of the package body in multiple rows and columns. However, the manufacturing methodology associated with such semiconductor package designs typically involves the completion of a sawing process wherein a saw blade is advanced completely through portions of the leadframe and partially into portions of the package body of the semiconductor package. More particularly, the advancement of the saw blade through portions of the leadframe effectively electrically isolates such portions from each other in a manner facilitating the formation of the multiple columns and rows of leads. However, as a result of the sawing or singulation of the leadframe to facilitate the formation of the leads, the saw blade must necessarily cut into the surface of the package body in which the surfaces of the leads connectable to an underlying substrate are exposed. In these semiconductor packages, the sawing process gives rise to frequent occurrences of chip-out in the package body, as well as the formation of minute cracks in the leads. As a result, the completed semiconductor package may have a weakened mechanical structure. Moreover, the partial cutting of the package body as occurs during the sawing of the leadframe to facilitate the formation of the leads is somewhat unsightly due to the resultant grooves or scratches formed in the corresponding surface of the package body. Further difficulties arise as a result of the mechanical stresses applied to the package body during the sawing process. These and other difficulties are addressed by the semiconductor package manufacturing methodology of the present invention, as will be described in more detail below.

BRIEF SUMMARY OF THE INVENTION

In accordance with the present invention, there is provided a method for fabricating a leadframe having a die paddle and two or more sets of leads which extend at least partially about the die paddle in spaced relation thereto and to each other. In one embodiment of the present invention, the formation of the leads of the leadframe is facilitated by the completion of a chemical etching process to the leadframe subsequent to the application and patterning of a photo resist applied thereto. In another embodiment of the present invention, the formation of both the leads and the die paddle of the leadframe is facilitated through the completion of a chemical etching process subsequent to the application and patterning of a photo resist applied to the leadframe. The electrical isolation of the leads of the leadframe from each other from the die paddle through the implementation of an etching process eliminates the need for the completion of a sawing process as is often used in the fabrication of prior art semiconductor packages including leads arranged in multiple rows and columns.

Further in accordance with the present invention, there is provided a manufacturing method for a semiconductor package including a leadframe wherein the leads alone or in combination with the die paddle are formed through the completion of the aforementioned chemical etching process.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
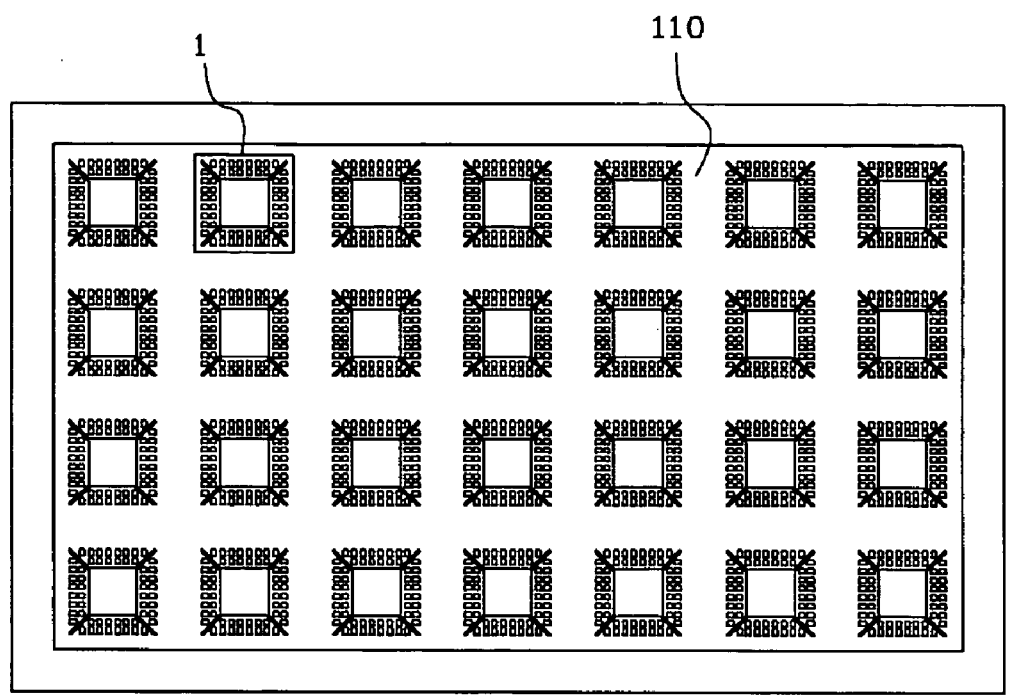
FIG. 1A is a top plan view of a strip having multiple leadframes each formed in accordance with a first embodiment of the present invention disposed thereon.

Referring now to the drawings wherein the showings are for purposes of illustrating preferred embodiments of the present invention only, and not for purposes of limiting the same, FIG. 1A is a top plan view of a leadframe strip having multiple leadframes 100 which are each formed in accordance with a first embodiment of the present invention disposed thereon. The leadframe strip comprises a layer of adhesive tape 110. The adhesive tape 110 has a generally planar first (top) surface 111 which has an adhesive property. In addition to the first surface 111, the adhesive tape 110 defines a generally planar second (bottom) surface 112 which is opposite the first surface 111. The adhesive tape may be fabricated from cellophane, vinyl, polyimide, or an equivalent, the present invention not being limited to any particular material for the adhesive tape 110.

As seen in FIG. 1A, multiple leadframes 100 are adhesively secured to the first surface 111 of the adhesive tape 110 in a matrix-like pattern defining multiple vertical columns and horizontal rows. Those of ordinary skill in the art will recognize that the 4×7 matrix including a total of 28 leadframes 100 secured to the adhesive tape 110 as shown in FIG. 1A is exemplary only, in that any number of leadframes 100 may be disposed on the adhesive tape 110 in any pattern.

Figure 1B:
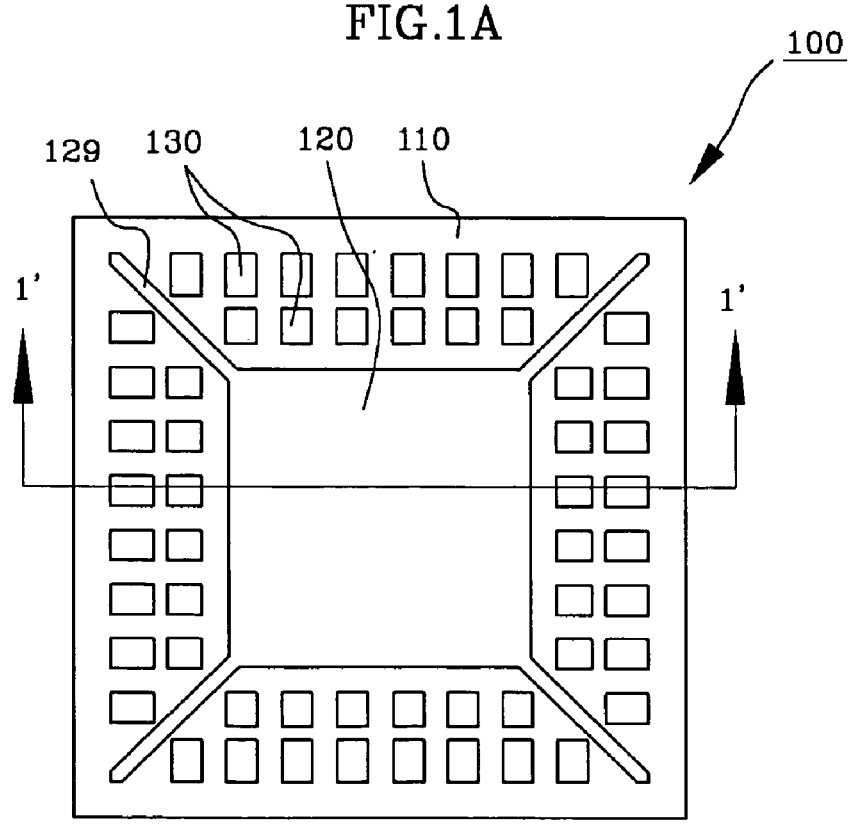
FIG. 1B is a enlargement of the region 1 shown in FIG. 1A, illustrating a leadframe formed in accordance with the first embodiment of the present invention.

Each leadframe 100 comprises a die paddle 120 having a generally planar first (top) surface 121 and an opposed, generally planar second (bottom) surface 122. The first surface 121 of the die paddle 120 is adapted to have a semiconductor die mounted thereto in a manner which will be described in more detail below. The second surface 122 of the die paddle 120 is bonded to the first surface 111 of the adhesive tape. The die paddle 120 has a generally quadrangular shape defining four sides or peripheral edge segments. Although the die paddle 120 is shown in FIGS. 1A and 1B as having a generally square configuration, those of ordinary skill in the art will recognize that the die paddle 120 may alternatively have any rectangular, octagonal or circular shape, the present invention not being limited to any particular shape for the die paddle 120. Extending diagonally from each of the four corners defined by the die paddle 120 is an elongate tie bar 129 of predetermined length. Though FIGS. 1A and 1B illustrate the tie bars 129 of the leadframe 100 as extending from each of the four corners of the die paddle 120, those of ordinary skill in the art will recognize that less than four tie bars 129 may be included in the leadframe 100, and that the tie bar(s) 129 may extend from any portion of the peripheral edge segment(s) of the die paddle 120.

Figure 1C:
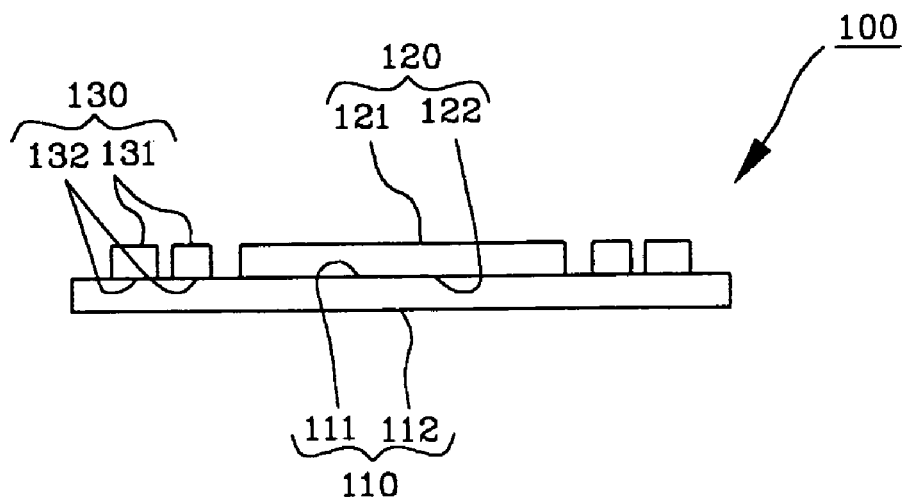
FIG. 1C is a cross-sectional view of the leadframe of the first embodiment taken along line 1'—1' of FIG. 1B.

In addition to the die paddle 120 and tie bars 129, each leadframe 100 comprises a plurality of leads 130. As best seen in FIGS. 1B and 1C the leads 130 are arranged in an inner set which circumvents the die paddle 120, and an outer set which circumvents the inner set. More particularly, the leads 130 of the inner set are segregated into four inner groups, with each of the inner groups including a total of six leads 130. Each inner group of the leads 130 extends along and in spaced relation to a respective one of the peripheral edge segments of the die paddle 120. Additionally, each adjacent pair of the inner groups of leads 130 is separated from each other by one of the tie bars 129. The leads 130 of the outer set are themselves segregated into four outer groups, each of the outer groups including a total of eight leads 130. The leads 130 of each outer group other than for those included at each end thereof are aligned with and spaced from respective ones of the leads 130 of the corresponding inner group. Like the inner groups of leads 130, each adjacent pair of the outer groups of leads 130 is separated by one of the tie bars 129. The leads 130 of the inner and outer sets each have a quadrangular configuration, with the leads 130 of the outer set being slightly larger than those of the inner set. Those of ordinary skill in the art will recognize that the leads 130 of the inner and outer sets may have differing shapes, and that each inner and outer group of the leads 130 may be provided in numbers fewer or greater than those indicated above.

In the leadframe 100, each of the leads 130 defines a generally planar first (top) surface 131, and an opposed, generally planar second (bottom) surface 132. The bottom surface 132 of each lead 130 is bonded to the first surface 111 of the adhesive tape 110. In the leadframe 100, the die paddle 120, the tie bars 129 and the leads 130 may be made of copper, a copper alloy, copper plated steel, or an equivalent thereof. However, those of ordinary skill in the art will recognize that the present invention is not limited to any particular material for the leadframe 100.

Figure 3A:
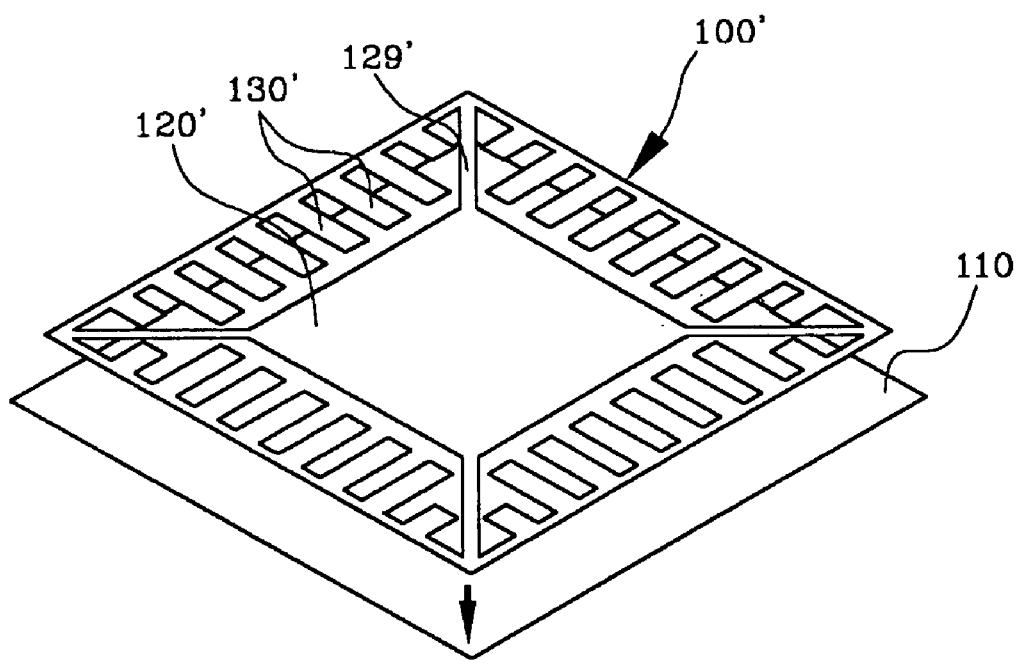
FIGS. 3A–3E illustrate an exemplary sequence of steps which may use to facilitate the fabrication of the leadframe of the first embodiment shown in FIGS. 1A–1C.
Figure 3B:
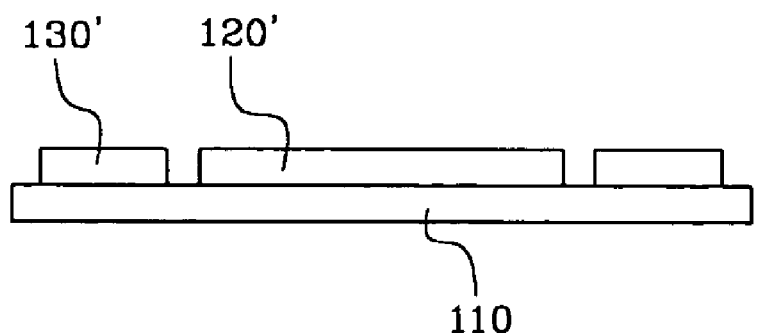

Referring now to FIGS. 3A–3E, there is shown an exemplary sequence of steps which may be used to facilitate the fabrication of the leadframe 100 of the first embodiment of the present invention. In the initial step of the fabrication method, a primary leadframe 100' is bonded to the first 111 of the adhesive tape 110 (FIGS. 3A and 3B). The primary leadframe 100' includes an outer frame which includes a quadrangular die paddle 120' disposed in the approximate center thereof. The die paddle 120' is integrally connected to the outer frame by four tie bars 129' which extend diagonally from respective corners of the die paddle 120'. Also integrally connected to the outer frame of the primary leadframe 100' is a plurality of leads 130'. The leads 130' are segregated into four sets, with the leads 130' of each set extending toward a respective one of the four peripheral edge segments defined by the die paddle 120'. The leads 130' of each set are of unequal lengths, with the outermost pair of leads 130' of each set being shorter than the remaining leads 130' of the same set. Those leads 130' of each set of greater length each define an inner, distal end which is disposed in spaced relation to a respective peripheral edge segment of the die paddle 120'. The outermost pair of leads 130' of each set extend to and are spaced from a respective one of the four tie bars 129'.

Figure 3C:
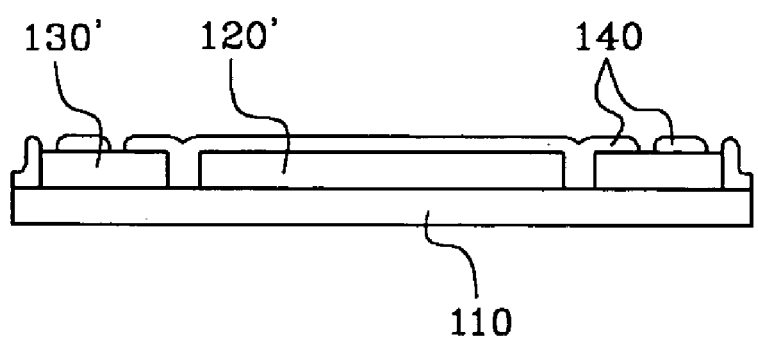

Subsequent to the bonding of the primary leadframe 100' to the adhesive tape 110, a photo resist 140 is coated in a predetermined pattern and in a predetermined thickness on the primary leadframe 100' and the adhesive tape 110 (FIG. 3C). More particularly, after coating, the photo resist 140 is patterned to expose certain areas or portions of each of the leads 130' of the primary leadframe 100'. Although each lead 130' is shown as having only one exposed area in FIG. 3C, those of ordinary skill in the art will recognize that each lead 130' may be coated and patterned so as to include two or more exposed areas, the present invention not being limited to any particular number of exposed areas or regions in each lead 130'.

Figure 3D:
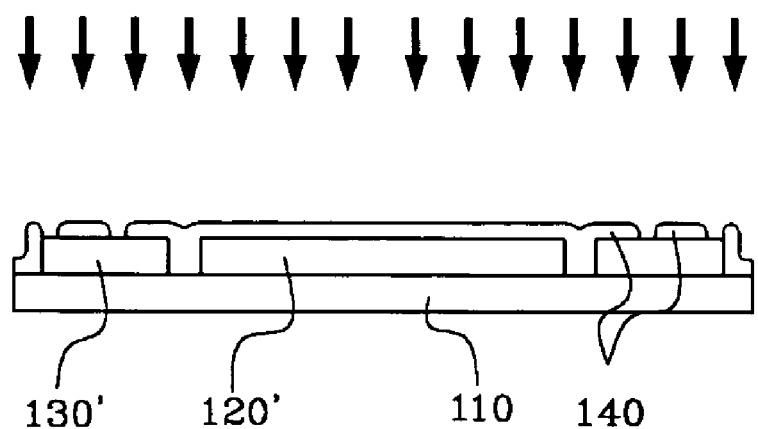

Subsequent to the coating and patterning of the leads 130' with the photo resist 140, the leads 130' are etched (FIG. 3D). A conventional etching gas or solution is used to etch and thus remove the exposed areas of the leads 130'. A suitable etching gas or solution may be, but is not limited to, CuCl2, FeCl2 or an equivalent which does not react with the photo resist 140. As a result of the etching process, the outer frame of the primary leadframe 100' is removed, with each of the leads 130' being divided in a manner facilitating the formation of the above-described leads 130 of the inner and outer sets. The removal of the outer frame of the primary lead frame 100' as a result of the etching process effectively electrically isolates the leads 130 of the outer set from each other, with the leads 130 of the inner set also being electrically isolated from each other and from the leads 130 of the outer set.

Figure 3E:
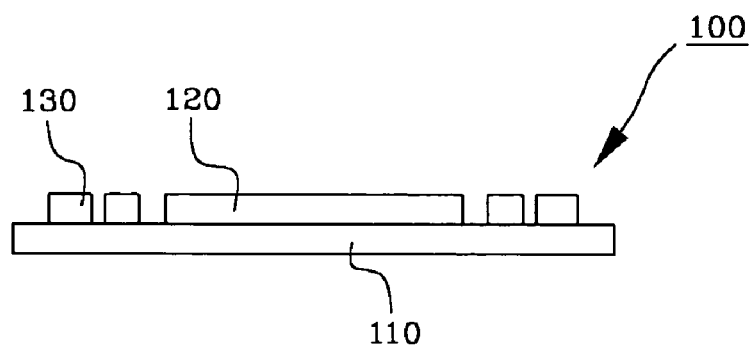

Upon the completion of the etching process, the photo resist 140 is removed (FIG. 3E). The removal of the photo resist 140 exposes the first surface 121 of the die paddle 120, and the first surfaces 131 of the leads 130. It is contemplated that as an alternative to the use of photo etching, the leadframe 100 may also be formed through the use of a laser or a blade subsequent to the bonding of the primary leadframe 100' to the adhesive tape 110. In other words, each of the leads 130' of the primary leadframe 100' may be divided or separated into two or more pieces or segments through the use of a laser or a blade so as to define the leads 130 arranged in the above-described pattern.

Figure 5A:
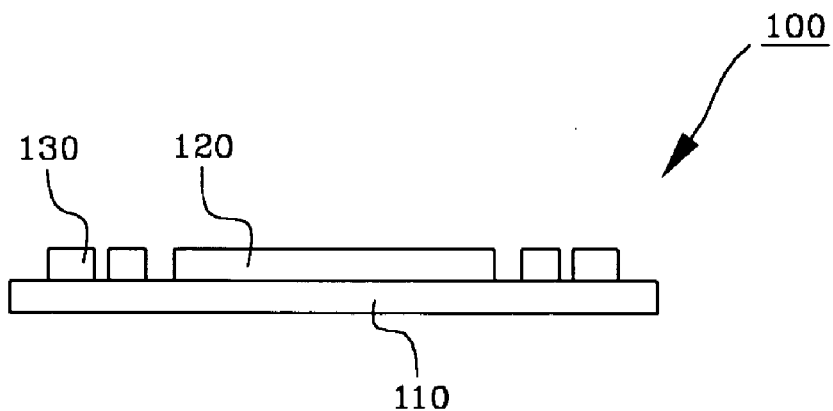
FIGS. 5A–5F illustrate an exemplary sequence of steps which may be used to facilitate the fabrication of a semiconductor package including the leadframe of the first embodiment shown in FIGS. 1A–1C.
Figure 5B:
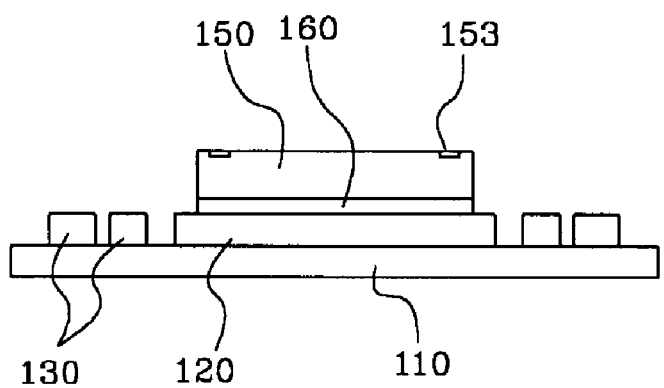

Referring now to FIGS. 5A–5F, there is shown an exemplary sequence of steps which may be used to facilitate the fabrication of a semiconductor package 101 which includes the above-described leadframe 100 constructed in accordance with the first embodiment of the present invention. The initial step of the semiconductor package manufacturing method comprises the fabrication of the leadframe 100 (FIG. 5A). The leadframe 100 is formed through the implementation of the steps described above in relation to FIGS. 3A–3E. Subsequent to the formation of the leadframe 100, a semiconductor die 150 is attached to the top surface 121 of the die paddle 120, such attachment preferably being facilitated through the use of an adhesive layer 160. The semiconductor die 150 includes a plurality of bond pads 153 which are disposed on the top surface thereof.

Figure 5C:
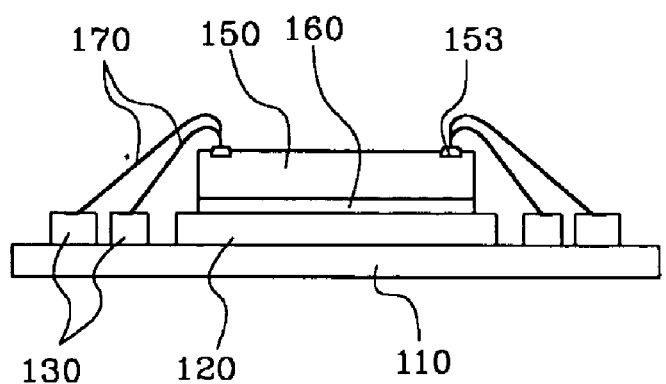

Subsequent to the attachment of the semiconductor die 150 to the die paddle 120, the bond pads 153 of the semiconductor die are electrically connected to the leads 130 of the inner and outer sets through the use of conductive wires 170 (FIG. 5C). The conductive wires 170 may each comprise an aluminum wire, a gold wire, a copper wire or an equivalent thereof, the present invention not being limited to any specific material for the conductive wires 170. As seen in FIG. 5C, the conductive wires 170 are preferably extended and secured to the first surfaces 131 of the leads 130.

Figure 5D:
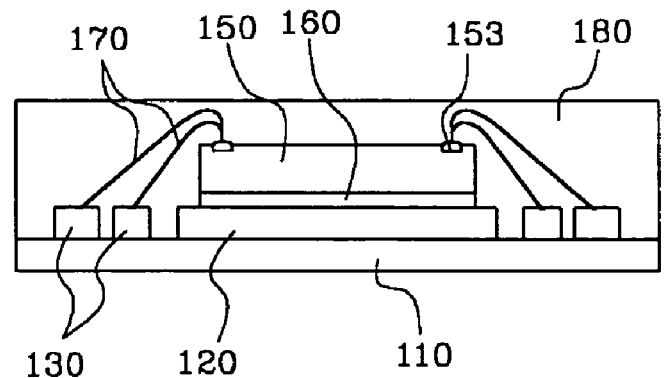
Figure 5E:
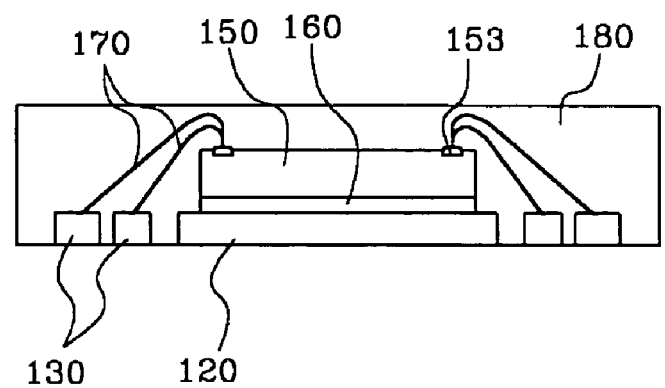

Subsequent to the electrical connection of the semiconductor die 150 to the leads 130 of the inner and outer sets through the use of conductive wires 170, the die paddle 120, semiconductor die 150, leads 130 and conductive wires 170 are encapsulated with an encapsulant which, upon hardening, forms a package body 180 of the semiconductor package 101 (FIG. 5D). The package body 180, and in particular the encapsulant used to fabricate the same, may be made of an epoxy molding compound, glop top material, or an equivalent thereof, though the present invention is not limited to any particular material for the package body 180. Subsequent to the formation of the package body 180, the adhesive tape 110 is removed from the bottom of the package body 180, the second surface 122 of the die paddle 120, and the second surfaces 132 of the leads 130 (FIG. 5E). As a result, the second surface 122 of the die paddle 120 is exposed in and substantially flush with the bottom surface of the package body 180. Similarly, the second surfaces 132 of the leads 130 are disposed in and substantially flush with the bottom surface of the package body 180.

Figure 5F:
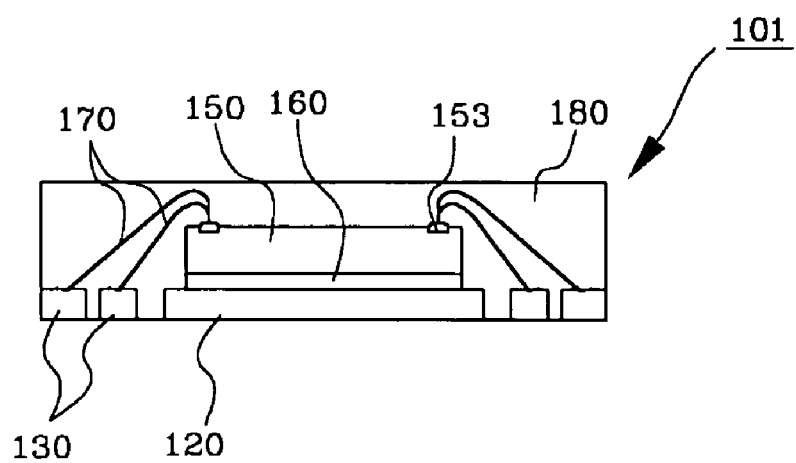

After the adhesive tape 110 has been removed from the package body 180, die paddle 120 and leads 130 in the above-described manner, a singulation step is completed wherein the peripheral portion of the package body 180 along the outer ends of the leads 130 of the outer set is trimmed through the implementation of either a punching or sawing process (FIG. 5F). As a result of the completion of this singulation step, the outer ends of the leads 130 of the outer set are exposed in and substantially flush with respective side surfaces of the package body. The completion of the singulation step completes the formation of the semiconductor package 101. As indicated above, the singulation step may be completed by sawing using a diamond blade, or by punching using a punch. The punching method singulates the side or peripheral portion of the package body 180 by a single punching operation to form the semiconductor package 101, while the sawing method saws along a desired contour for the final semiconductor package 101 using a diamond blade.

Figure 6A:
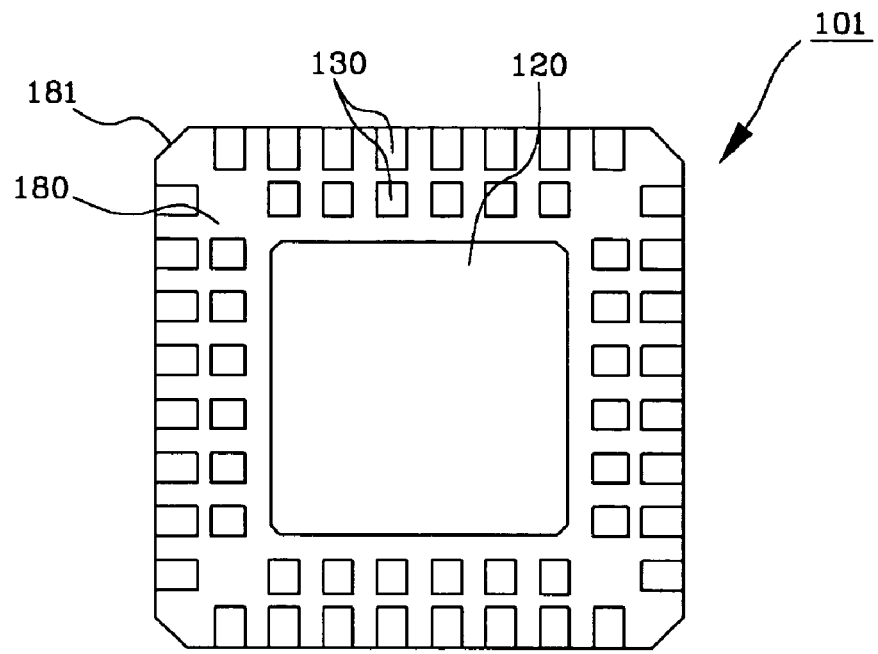
FIG. 6A is a bottom plan view of a semiconductor package including the leadframe of the first embodiment shown in FIGS. 1A–1C.

A bottom plan view of the completed semiconductor package 101 fabricated to include the leadframe 100 is shown in FIG. 6A. As explained above, in the complete semiconductor package 101, the second surface 122 of the die paddle 120 is exposed in and substantially flush with the generally planar bottom surface of the package body 180. The second surfaces 132 of the leads 130 are also exposed in and substantially flush with the bottom surface of the package body 180, the leads 130 being arranged in the inner and outer sets as described above. The tie bars 129 of the leadframe 100 are covered by the package body 180, and thus are not visually apparent in the completed semiconductor package 101. The four corners of the package body 180 may each optionally include a chamfer 181 which may be formed by a punching singulation process. The semiconductor package 101 fabricated to include the leadframe 100 has an increased number of leads 130, and hence available input and output terminals. In addition, there is no requirement to saw the leads 130 or the package body 180 to facilitate the electrical isolation of the leads 130 during the manufacture of the semiconductor package 101. Thus, the semiconductor package 101 is not physically impacted by a sawing process, and thus does not suffer from the above-described deficiencies attendant to the lead sawing process.

Figure 2A:
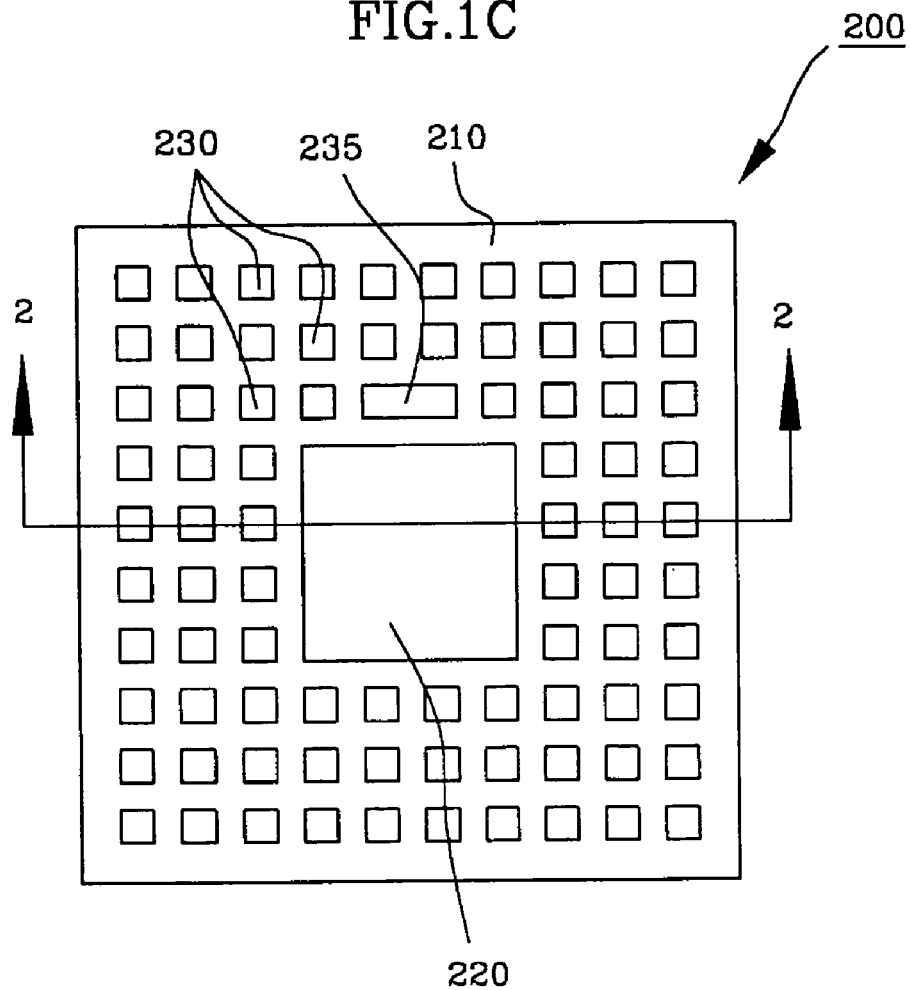
FIG. 2A is a top plan view of a leadframe formed in accordance with a second embodiment of the present invention.
Figure 2B:
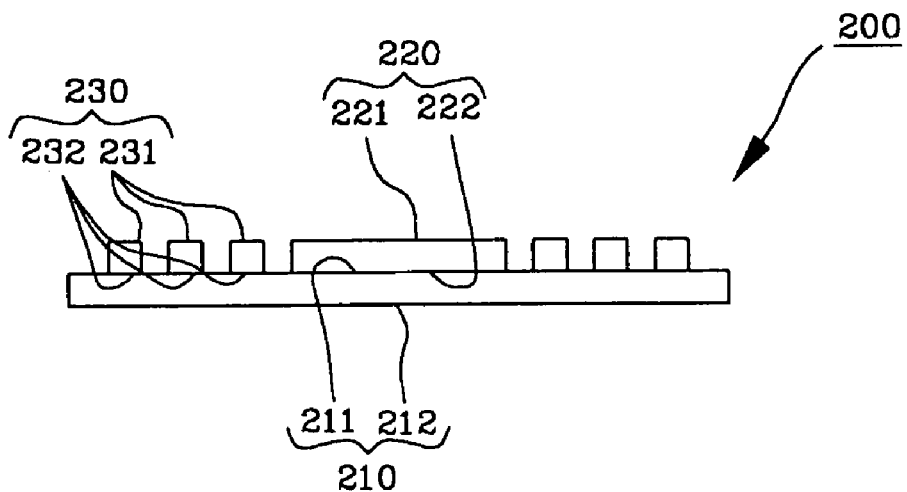
FIG. 2B is a cross-sectional view of the leadframe of the second embodiment taken along line 2—2 of FIG. 2A.

Referring now to FIGS. 2A and 2B, there is shown a leadframe 200 which is formed in accordance with a second embodiment of the present invention. In FIGS. 2A and 2B, the 200 series reference numerals are used to identify elements corresponding to those identified with the 100 series reference numerals shown in FIGS. 1A–1C. One of the distinctions between the leadfarmes 100, 200 lies in the omission in the leadframe 200 of the tie bars 129 described above in relation to the leadframe 100. A further distinction lies in the number and arrangement of leads 230 in the leadframe 200 in comparison to the number and arrangement of leads 130 in the leadframe 100. More particularly, in the leadframe 200, the leads 230 are arranged in an inner set which circumvents the die paddle 220, a middle set which circumvents the inner set, and an outer set which circumvents the middle set. Due to the absence of the above-described tie bars 129 in the leadframe 200, leads 230 of the inner, middle and outer sets are arranged to extend diagonally from respective ones of the four corners defined by the die paddle 220. As shown in FIG. 2A, the number of leads 230 in the outer set exceeds the number of leads 230 in the middle set, with the number of leads 230 in the middle set exceeding the number of leads 230 in the inner set. The leads 230 of the inner, middle and outer sets are arranged and spaced relative to each other such that multiple vertical columns and horizontal rows are defined thereby. Though each of the leads 230 is shown in FIGS. 2A and 2B as having a quadrangular (e.g., square) configuration, those of ordinary skill in the art will recognize that the leads 230 may have differing shapes (e.g., circular), and may be provided in numbers fewer or greater than shown in FIG. 2A. In the leadframe 200, included in the inner set of leads 230 is a rectangular lead 235 which may be used to transfer signals between a semiconductor die attached to the die paddle 220 and other leads 230. In other words, the semiconductor die and the rectangular lead 235 may be interconnected by a conductive wire, with the rectangular lead 235 itself being connected to one or more other leads 230 by conductive wire(s). Such a configuration prevents wire sweeping caused by an excessively long conductive wire.

Figure 4A:
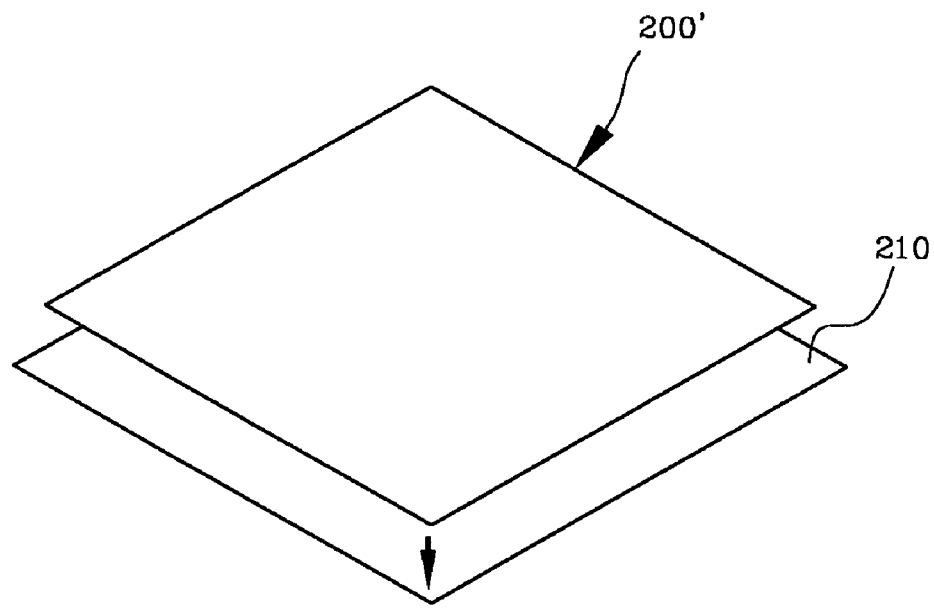
FIGS. 4A–4E illustrate an exemplary sequence of steps which may be used to facilitate the fabrication of the leadframe of the second embodiment shown in FIGS. 2A and 2B.
Figure 4B:
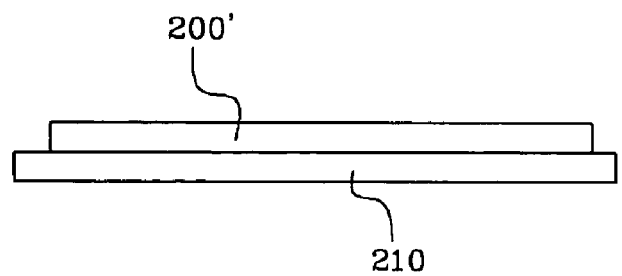

Referring no to FIGS. 4A–4E, there is shown an exemplary sequence of steps which may be used to facilitate the fabrication of the leadframe 200 of the second embodiment of the present invention. In the initial step of the fabrication method, a metallic, substantially planar plate 200' is bonded to the adhesive tape 210 which is preferably formed by applying an adhesive to cellophane, vinyl or polyimide (FIGS. 4A and 4B). The plate 200' is preferably fabricated from copper, a copper alloy, copper plated steel, or an equivalent thereof, though the manufacturing methodology for the leadframe 200 is not limited to any specific material for the plate 200'.

Figure 4C:
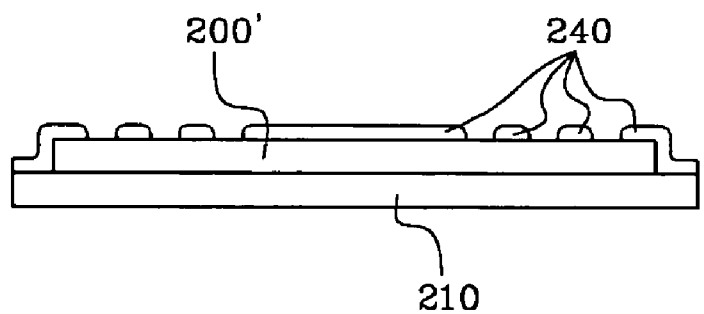

Subsequent to the bonding of the plate 200' to the adhesive tape 210, a photo resist 240 is coated in a predetermined pattern and in a predetermined thickness on the plate 200' and the adhesive tape 210 (FIG. 4C). More particularly, after coating, the photo resist 240 is patterned to expose certain areas or portions of the plate 200'. As will be recognized, the exposed areas in the photo resist 240 will eventually define the spaces between the die paddle 220 and leads 230, 235, and between the leads 230, 235 themselves.

Figure 4D:
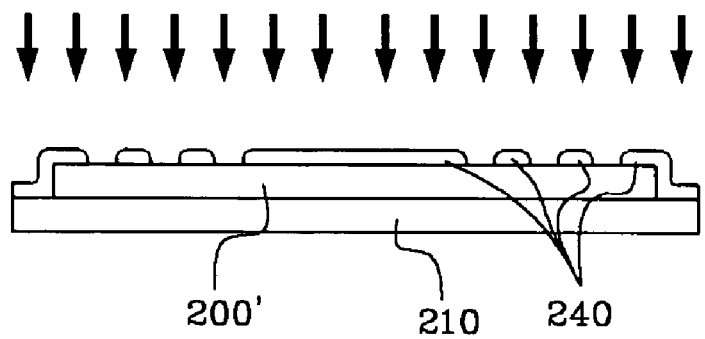

Subsequent to the coating and patterning of the plate 200' with the photo resist 240, the plate 200' is etched (FIG. 4D). A conventional etching gas or solution is used to etch and thus remove the exposed areas of the plate 200'. A suitable etching gas or solution may be, but is not limited to, CuCl2, FeCl2 or an equivalent which does not react with the photo resist 240. As a result of the etching process, the die paddle 220 and leads 230, 235 are formed, the leads 230, 235 being electrically isolated from the die paddle 220 and from each other.

Figure 4E:
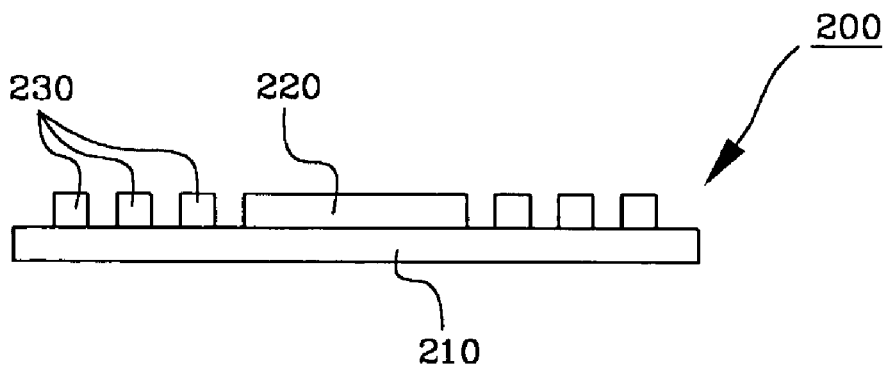

Upon the completion of the etching process, the photo resist 240 is removed (FIG. 4E). The removal of the photo resist 240 exposes the first surface 221 of the die paddle 220 and the first surfaces 231 of the leads 230. It is contemplated that as an alternative to the use of photo etching, the leadframe 200 may also be formed through the use of a laser or blade subsequent to the bonding of the plate 200' to the adhesive tape 210.

Figure 6B:
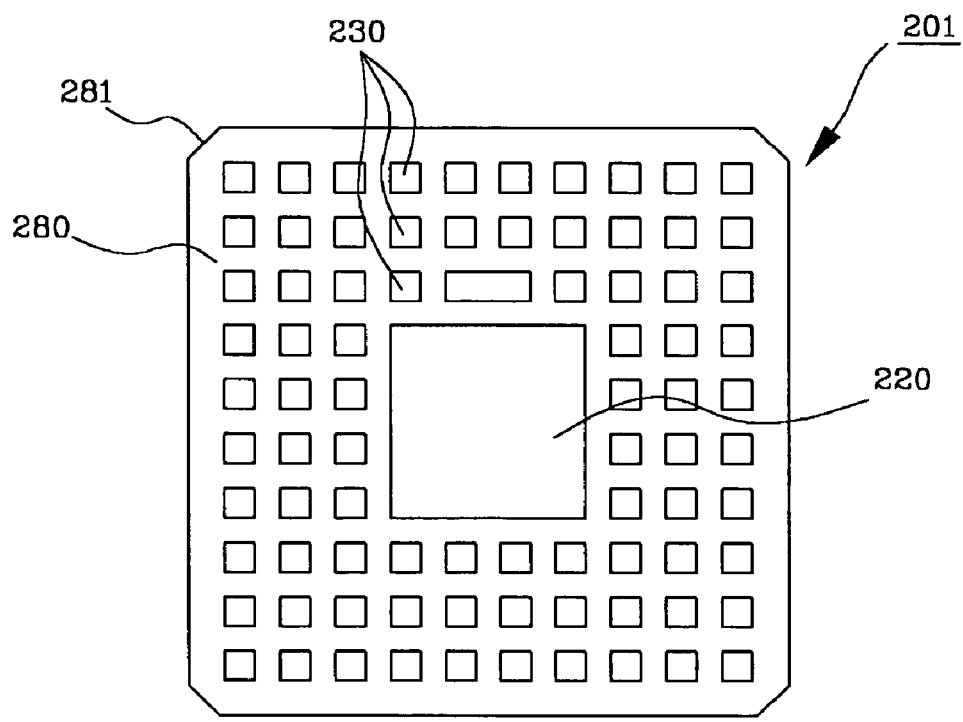
FIG. 6B is a bottom plan view of a semiconductor package including the leadframe of the second embodiment shown in FIGS. 2A and 2B.

Referring now to FIG. 6B, there is shown a bottom plan view of a semiconductor package 201 fabricated using the above-described leadframe 200 of the second embodiment. The steps used to facilitate the fabrication of the semiconductor package 201 are the same as those described above and shown in FIGS. 5A–5F in relation to the fabrication of the semiconductor package 101 including the leadframe 100 of the first embodiment. In the fabrication process for the semiconductor package 201, the removal of the adhesive tape 210 from the bottom surface of the package body 280 of the semiconductor package 201 effectively exposes the second surface 222 of the die paddle 220 and second surfaces 232 of the leads 231 in the bottom surface of the package body 280. The second surfaces 222, 232 are generally planar and substantially flush with the generally planar bottom surface of the package body 280. The package body 280 may also be formed to include chamfered corners 281 in the same manner described above in relation to the chamfered corners 181 of the package body 180 of the semiconductor package 101.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A method for manufacturing a semiconductor package, comprising the steps of:
   a) bonding a primary leadframe to an adhesive tape layer, the primary leadframe including a die paddle and a plurality of leads which extend at least partially about the die paddle in spaced relation thereto;
   b) applying a photo resist to the primary leadframe and to the adhesive tape layer;
   c) patterning the photo resist to define at least one exposed area in each of the leads of the primary leadframe;
   d) etching the exposed area of each of the leads to divide the leads into an inner set which extends at least partially about the die paddle and an outer set which extends at least partially about the inner set; and
   e) removing the photo resist from the die paddle and from the inner and outer sets of the leads.

2. The method of claim 1 wherein:
   the primary leadframe bonded to the adhesive tape layer in step (a) includes an outer frame having the leads integrally connected thereto, and at least one tie bar which is integrally connected to and extends between the outer frame and the die paddle;

step (c) comprises patterning the photo resist to expose the outer frame; and step (d) comprises etching the outer frame to remove the outer frame from the primary leadframe.

3. The method of claim 1 wherein:

each of the leads of the primary leadframe bonded to the adhesive tape layer in step (a) has a generally planar first surface and an opposed, generally planar second surface which is bonded to the adhesive tape layer;

step (c) comprises patterning the photo resist to expose a portion of the first surface of each of the leads; and step (e) comprises removing the photo resist to expose the first surface of each of the leads of the inner and outer sets.

4. The method of claim 3 wherein the leads of the primary leadframe bonded to the adhesive tape layer in step (a) each have a generally quadrangular configuration.

5. The method of claim 3 wherein:

the die paddle of the primary leadframe bonded to the adhesive tape layer in step (a) has a generally planar first surface and an opposed, generally planar second surface which is bonded to the adhesive tape layer; and step (e) comprises removing the photo resist to expose the first surface of the die paddle.

6. The method of claim 5 wherein the die paddle of the primary leadframe bonded to the adhesive tape layer in step (a) has a generally quadrangular configuration.

7. The method of claim 6 wherein the die paddle of the primary leadframe bonded to the adhesive tape layer in step (a) has an elongate tie bar extending diagonally from each of four corners defined thereby.

8. The method of claim 1 further comprising the steps of:

f) attaching a semiconductor die to the die paddle;

g) electrically connecting the semiconductor die to at least one of the leads of each of the inner and outer sets via conductive wires;

h) at least partially encapsulating the semiconductor die, the die paddle, the leads and the conductive wires with a package body; and i) removing the adhesive tape layer from the package body to expose portions of the die paddle and the leads of the inner and outer sets in a common exterior surface of the package body.

9. A method for manufacturing a semiconductor package, comprising the steps of:

a) bonding a generally planar plate to an adhesive tape layer;

b) applying a photo resist to the plate and to the adhesive tape layer;

c) patterning the photo resist to define multiple exposed areas in the plate;

d) etching the exposed areas of the plate to divide the plate into a die paddle and at least an inner set of leads which extends at least partially about the die paddle and an outer set of leads which extends at least partially about the inner set; and e) removing the photo resist from the die paddle and from the inner and outer sets of the leads.

10. The method of claim 9 wherein step (d) comprises etching the exposed areas of the plate to divide the plate into a die paddle, an inner set of leads which extends at least partially about the die paddle, a middle set of leads which extends at least partially about the inner set, and an outer set of leads which extends at least partially about the middle set.

11. The method of claim 10 wherein:

each of the leads formed by etching the exposed areas in step (d) has a generally planar first surface and an opposed, generally planar second surface which is bonded to the adhesive tape layer; and step (e) comprises removing the photo resist to expose the first surface of each of the leads of the inner, middle and outer sets.

12. The method of claim 11 wherein each of the leads of the inner, middle and outer sets formed by the etching of the exposed areas in step (d) has a generally quadrangular configuration.

13. The method of claim 11 wherein:

the die paddle formed by the etching of the exposed areas in step (d) has a generally planar first surface and an opposed, generally planar second surface which is bonded to the adhesive tape layer; and step (e) comprises removing the photo resist to expose the first surface of the die paddle.

14. The method of claim 13 wherein the die paddle formed by the etching of the exposed areas in step (d) has a generally quadrangular configuration.

15. The method of claim 9 further comprising the steps of:

f) attaching a semiconductor die to the die paddle;

g) electrically connecting the semiconductor die to at least one of the leads of each of the inner and outer sets via conductive wires;

h) at least partially encapsulating the semiconductor die, the die paddle, the leads and the conductive wires with a package body; and i) removing the adhesive tape layer from the package body to expose portions of the die paddle and the leads of the inner and outer sets in a common exterior surface of the package body.

* * * * *